United States Patent
Faley

(10) Patent No.: US 9,666,783 B2
(45) Date of Patent: May 30, 2017

(54) REPRODUCIBLE STEP-EDGE JOSEPHSON JUNCTION

(71) Applicant: Forschungszentrum Juelich GmbH, Juelich (DE)

(72) Inventor: Mikhail Faley, Juelich (DE)

(73) Assignee: Forschungszentrum Juelich GmbH, Juelich (DE)

( * ) Notice: Subject to any disclaimer, the term of this patent is extended or adjusted under 35 U.S.C. 154(b) by 30 days.

(21) Appl. No.: 14/389,839

(22) PCT Filed: Mar. 13, 2013

(86) PCT No.: PCT/DE2013/000146
§ 371 (c)(1),
(2) Date: Oct. 1, 2014

(87) PCT Pub. No.: WO2013/149607
PCT Pub. Date: Oct. 10, 2013

(65) Prior Publication Data
US 2015/0069331 A1    Mar. 12, 2015

(30) Foreign Application Priority Data

Apr. 4, 2012 (DE) .......... 10 2012 006 825
Dec. 15, 2012 (DE) .......... 10 2012 024 607

(51) Int. Cl.
*H01L 39/22* (2006.01)
*H01L 39/24* (2006.01)
(Continued)

(52) U.S. Cl.
CPC .......... *H01L 39/025* (2013.01); *H01L 39/126* (2013.01); *H01L 39/225* (2013.01); *H01L 39/2461* (2013.01); *H01L 39/2496* (2013.01)

(58) Field of Classification Search
CPC ..... H01L 39/025; H01L 39/042; H01L 39/08; H01L 39/126; H01L 39/223; H01L 39/225; H01L 39/2461; H01L 39/2496
(Continued)

(56) References Cited

U.S. PATENT DOCUMENTS 5,157,466 A * 10/1992 Char ............... H01L 39/2496
257/33
5,366,953 A * 11/1994 Char ............... H01L 39/2496
257/33
(Continued)

FOREIGN PATENT DOCUMENTS

DE   10 2009 025 716   12/2010
WO   WO-92/16974       10/1992
(Continued)

OTHER PUBLICATIONS

Mitchell et al., YBCO Step-Edge Junctions: Influence of Morphology on Junction Transport, IEEE Transactions on Applied Superconductivity, vol. 21, No. 2, 2011, pp. 371-374.*
(Continued)

*Primary Examiner* — Earl Taylor
(74) *Attorney, Agent, or Firm* — Norris McLaughlin & Marcus, P.A.

(57) ABSTRACT

An electronic component comprising a Josephson junction and a method for producing the same are proposed. The component comprises a substrate having at least one step edge in the surface thereof and a layer made of a high-temperature superconducting material disposed thereon, wherein this layer, at the step edge, has a grain boundary that forms the one or two weak links of the Josephson junction. On both sides of the step edge, the a and/or b crystal axes in the plane of the high-temperature superconducting layer are oriented perpendicularly to the grain boundary to within a deviation of no more than 10°, as a result of a texturing of
(Continued)

the substrate and/or at least one buffer layer disposed between the substrate and the high-temperature superconducting layer. This can be technologically implemented, for example, by growing on the HTS layer by way of graphoepitaxy. By orienting the same crystal axis in each case perpendicularly to the step edge on both sides of the step edge, a maximal supercurrent can flow across the grain boundary induced by the step edge, and consequently across the Josephson junction.

29 Claims, 15 Drawing Sheets

(51) Int. Cl.
  *H01L 39/02* (2006.01)
  *H01L 39/12* (2006.01)
(58) Field of Classification Search
  USPC .................................. 257/34; 438/2
  See application file for complete search history.

(56) References Cited

U.S. PATENT DOCUMENTS

| | | | | |
|---|---|---|---|---|
| 5,667,650 | A * | 9/1997 | Face | C23C 14/0063 204/192.24 |
| 6,514,774 | B1 * | 2/2003 | Foley | H01L 39/2464 438/2 |
| 6,645,639 | B1 * | 11/2003 | Sambasivan | C23C 8/02 428/469 |
| 6,730,410 | B1 * | 5/2004 | Fritzemeier | H01L 39/2461 428/469 |
| 6,999,806 | B2 * | 2/2006 | Adachi | H01L 39/225 257/32 |
| 7,208,196 | B2 * | 4/2007 | Sambasivan | C23C 8/02 427/248.1 |
| 8,119,571 | B2 * | 2/2012 | Goyal | C23C 14/08 136/252 |
| 9,023,764 | B2 * | 5/2015 | Araki | C04B 35/4508 174/125.1 |
| 2003/0207132 | A1 * | 11/2003 | Sambasivan | C23C 8/02 428/469 |
| 2004/0077504 | A1 * | 4/2004 | Adachi | H01L 39/225 505/234 |
| 2004/0096587 | A1 * | 5/2004 | Sambasivan | C23C 8/02 427/378 |
| 2008/0026234 | A1 * | 1/2008 | Sambasivan | C23C 8/02 428/469 |
| 2009/0088325 | A1 * | 4/2009 | Goyal | C23C 14/08 505/230 |
| 2013/0210635 | A1 * | 8/2013 | Semerad | H01L 39/2461 505/230 |
| 2014/0031236 | A1 * | 1/2014 | Araki | C04B 35/4508 505/237 |
| 2015/0069331 | A1 * | 3/2015 | Faley | H01L 39/225 257/34 |

FOREIGN PATENT DOCUMENTS

| | | |
|---|---|---|
| WO | WO-00/28605 | 5/2000 |
| WO | WO-2010/145631 | 12/2010 |

OTHER PUBLICATIONS

Lee S G et al: "Effects of d-wave symmetry in high Tc step-edge Josephson junctions", Physica C, North-Holland Publishing, Amsterdam, NL, vol. 341-348, Nov. 1, 2000 (Nov. 1, 2000), pp. 1473-1474, XP0022714063, ISSN: 0921-4534, DOI: 10.1016/S0921-4534(00)01086-8 [retrieved on Nov. 1, 2000] p. 1473, right-hand column, line 10—p. 1474, right hand column, line 27; figures 1, 2.

Alexander D Mashtakov et al: "High-Superconducting Step-Edge Junction on Sapphire Fabricated by Non-Etching Technique", IEEE Transactions on Applied Superconductivity, IEEE Service Center, Los Alamitos, CA, US, vol. 9, No. 2, Jun. 1, 1999 (Jun. 1, 1999), XP011082649 ISSN: 1051-8223 p. 3001, left-hand column, line 16—p. 3003, right-hand column, line 7; figure 1; table 1.

Givargizov: "Graphoepitaxy as an approach to oriented crystallization on amorphous substrates" Journal of Crystal Growth, Elsevier, Amsterdam, NL, vol. 310, No. 7-9, Apr. 1, 2008 (Apr. 1, 2008), pp. 1686-1690, XP022697512, ISSN: 0022-0248, DOI: 10.1016/J.JCRYSGRO.2007.11.052 [retrieved on Nov. 19, 2007] p. 1686, left-hand column, line 21—p. 1687, left-hand column, line 3.

(E. Mitchell, C. P. Foley, "YBCO step-edge junctions with high JcRn", Superconductor Science and Technology 23, 065007 (2010), doi:10.1088/0953-2048/23/6/065007). p. 1-11.

Z. Hao, Yu. Wu, Y. Enomoto, K. Tanabe, and N. Koshizuka, "Microstructure and magnesium diffusion in YBa2Cu3O7-d d films on bicrystal MgO Substrates" Journal of Applied Physics 91 (11), p. 9251-9254 (2002)).

Jia Du et al., "Trimming, stability and passivation of YBCO step-edge junctions", Physica C 391 (2003) 31-41.

E. E. Mitchell et al., "The effec of MgO substrate roughness on YBa2Cu3O7-δ thin film properties", Thin Solid Films 437 (2003) 101-107.

J. Du et al., "Influence of MgO surface conditions on the in-plane crystal orientation and critical current density of epitaxial YBCO films", Physica C 400 (2004) 143-152.

* cited by examiner

REPRODUCIBLE STEP-EDGE JOSEPHSON JUNCTION

BACKGROUND OF THE INVENTION

The invention relates to an electronic component comprising a Josephson junction and to a method for producing the same.

Josephson junctions between high-temperature superconducting (high $T_c$, HTS) electrodes are a basic building block of superconducting electronics. They are used, among other things, for superconducting quantum interference devices (SQUIDs) for highly sensitive magnetic field measurement and in detectors for THz radiation.

The essential characteristics of a Josephson junction are the critical current density $J_c$ of the superconducting state and the normal-state resistance $R_n$. These variables, and their $J_c*R_n$ product (or $I_c*R_n$ with the critical current $I_c$) in particular, are known as quality criteria for the usability of Josephson junctions for the above-mentioned purposes from (E. Mitchell, C. P. Foley, "YBCO step-edge junctions with high JcRn", Superconductor Science and Technology 23, 065007 (2010). doi:10.1088/0953-2048/23/6/065007). This document discloses that both $J_c$ and $R_n$ at the grain boundary of a YBCO HTS layer are highly dependent on the angle θ between the crystal orientations of the two grains in the $YBa_2Cu_3O_{7-x}$ (YBCO). It is therefore proposed to grow the layer on a substrate, the surface of which has a step edge. The Josephson junction is created on the upper edge of a slide-shaped step of the substrate surface by introducing a sharp bend having an angle of θ degrees into the crystal structure of YBCO at the edge. A grain boundary forms in the YBCO at the step edge, wherein the angle θ is predefined by the bend angle of the step edge. The bend causes local strain, and consequently a local oxygen deficiency in the YBCO at the grain boundary. The region of the bend therefore acts in the manner of a tunnel contact barrier between two differently oriented d-wave superconductors, and thus forms the weak link of the Josephson junction.

Some of the Josephson junctions produced this way in fact include the high $J_c*R_n$ product hoped for. The drawback is that reproducibility so far is only satisfactory for proof of basic feasibility (proof of concept), not, however, for large-scale production because a high rate of scrap is incurred.

It is therefore the object of the invention to make Josephson junctions made of high-temperature superconductors available which have a high $J_c*R_n$ product and can also be more reproducibly produced than according to the present state of the art.

This object is achieved according to the invention by a component comprising a Josephson junction according to the main claim and by a production method according to the additional independent claim. Further advantageous embodiments will be apparent from the dependent claims referring back to these claims. The invention further relates to a detector for THz radiation and to a SQUID, in which the component according to the invention is used.

SUMMARY OF THE INVENTION

Within the scope of the invention, a component comprising a Josephson junction was developed. This component includes a substrate having at least one step edge in the surface thereof and a layer made of a high-temperature superconducting material disposed thereon, wherein this layer, at the step edge, has a grain boundary that forms the weak link of the Josephson junction. This layer is referred to as the functional layer hereinafter.

The step edge shall not be understood to mean the outer edge of the substrate at which the substrate, and consequently also the HTS layer located thereon, ends. A step edge within the meaning of the present invention is rather an edge that is located within the surface region of the substrate, so that the HTS layer located on the substrate extends on both sides of this step edge.

According to the invention, on both sides of the step edge, the a and/or b crystal axes in the plane of the high-temperature superconducting layer (functional layer) are oriented perpendicularly to the grain boundary to within a deviation of no more than 10°, as a result of a texturing of the substrate and/or at least one buffer layer disposed between the substrate and the high-temperature superconducting layer (functional layer). This can be technologically implemented, for example, by growing the HTS layer (functional layer) on the textured surface by way of graphoepitaxy.

The component according to the invention can thus alternatively be characterized in that the high-temperature superconducting functional layer is grown on a textured substrate and/or on a textured buffer layer disposed between the substrate and the high-temperature superconducting functional layer by way of graphoepitaxy. As a result of the texturing, the a and/or b crystal axes in the plane of the high-temperature superconducting functional layer are oriented perpendicularly to the grain boundary to within a deviation of no more than 10°, on both sides of the step edge.

The orientation of the a-axis or b-axis of the HTS layer is understood to mean that the axes of more than 90% of grains of which the HTS layer is composed are oriented. Generally, there are always isolated grains with misorientation, but then these no longer play a major role for current transport.

The orientation of both the a-axis and of the b-axis shall be understood to mean that the a-axis of a portion of the grains and the b-axis of a portion of the grains are oriented perpendicularly to the step edge.

It was found that the superconducting properties of HTS layers in the layer plane are very anisotropic. The wave function of the Cooper pairs carrying the supercurrent has a large amplitude along the a and b crystal axes, wherein it has a phase offset by 180° with respect to the a crystal axis along the b crystal axis. In the direction at 45° with respect to the two crystal axes a and b of the HTS layer, the amplitude of the wave function of the Cooper pairs is equal to zero. A high supercurrent can thus essentially only be transported along the a and b crystal axes. So as to allow the supercurrent to also be transported beyond the step edge, it is necessary for the a or b crystal axis of the HTS layer to be oriented toward the step edge on both sides of the step edge. If, in contrast, the crystal structure is oriented at an angle of 45° with respect to the a-axis and b-axis on at least one side of the step edge, no supercurrent ($I_c=0$) flows across the Josephson junction. In this case, additionally zero-energy states develop, which drastically lower the normal-state resistance $R_n$ (and consequently also the $I_c*R_n$ product) of the Josephson junction.

By thus orienting the a and/or b crystal axes in each case perpendicularly to the step edge on both sides of the step edge, a maximal supercurrent can flow across the grain boundary induced by the step edge, and consequently across the Josephson junction. According to the present state of the art, the in-plane orientation of the a-axis and b-axis in the layer plane was not controlled, but formed randomly. The produced layers therefore also included many grains in which the a-axis and/or b-axis formed an angle of 45° with the step edge; current transport through these grains was therefore minimal precisely in the direction that is of interest.

In a particularly advantageous embodiment of the invention, an anti-epitaxial buffer layer is disposed between the high-temperature superconducting layer (functional layer) and the substrate, wherein this anti-epitaxial buffer layer is either amorphous or has a crystal structure that is not epitaxy-compatible with the substrate and/or with the high-temperature superconducting layer, so that the c-axis of the high-temperature superconducting layer (functional layer) is oriented based on the most energetically favorable own growth direction, and is thus perpendicular to the layer plane to within a deviation of no more than 10°. The layer plane follows the bend in the substrate surface. It is important for anti-epitaxy that the orientation of the layer according to its own phase diagram, for example, due to the layered composition of YBCO layers, is energetically preferred as compared to the orientation corresponding to the coupling to the substrate. The high-temperature superconducting functional layers, and more particularly YBCO layers, are to follow their natural tendency to grow more quickly in the layer plane than in the c-direction perpendicular to the layer plane. This can be achieved by a thin amorphous layer or by a layer that is so strongly epitaxially incompatible that a large number of stresses are formed on the interface to the HTS layer. A third option is a very thin (approximately 1 nm, and preferably 0.3 to 1 nm) anti-epitaxial layer made of a material having crystal structure parameters that differ considerably from the crystal structure parameters of the substrate. In this case, the two crystal structures have an effect on the orientation of the HTS layer, mutually weakening their effects on the HTS layer.

For example, a first epitaxial layer made of yttria-stabilized zirconia (YSZ) can be disposed on a MgO substrate, the layer serving as a mediator for the actual anti-epitaxial layer made of $CeO_2$. The superconducting YBCO layer can be disposed thereon.

An anti-epitaxial buffer layer according to the invention causes the c-axis of the HTS layer to be oriented perpendicularly to the layer plane even if the substrate has a crystal structure and lattice constant that are compatible with the HTS layer. It is thus ensured that a grain boundary in the HTS layer always forms at the step edge. At the edge of the slide-shaped step, the bend in the substrate surface causes a sharp bend in the crystal structure of the HTS layer, so that a Josephson junction develops. In the case of epitaxial growth that is oriented on the substrate, in contrast, no grain boundary develops at the step edge with step angles θ<45°, and preferably <19°, so that no Josephson junction is formed there. A, preferably thin, anti-epitaxial intermediate layer additionally ensures that both the a-axis and the b-axis are located in the layer plane, and current transport through the layer is facilitated in two dimensions. Control over the a-axis and b-axis is possible by way of in-plane texturing.

The anti-epitaxial buffer layer advantageously has a thickness of 10 nm or less, preferably of 1 nm or less, and particularly preferably of 0.5 nm or less. If the texturing is provided in the substrate or in a further layer between the anti-epitaxial buffer layer and the substrate, this low layer thickness ensures that the texturing can still have decisive influence on the crystal orientation of the HTS layer in the layer plane.

Advantageously each lattice constant of the anti-epitaxial buffer layer in the layer plane is closer to the lattice constants a and b in the plane of the high-temperature superconducting layer (functional layer) than to any integer multiple or divisor of the lattice constant c of this layer. This avoids the c-axis of the HTS layer being oriented in the plane of the anti-epitaxial buffer layer.

In a particularly advantageous embodiment, the anti-epitaxial buffer layer is textured. This texturing is then in direct contact with the HTS layer and acts maximally on the crystal orientation of the same in the plane.

As an alternative or in combination therewith, a further textured buffer layer is disposed between the substrate and the anti-epitaxial buffer layer, or between the anti-epitaxial buffer layer and the high-temperature superconducting layer (functional layer), in a further particularly advantageous embodiment of the invention. The functions of the two buffer layers are then separated from each other and can be optimized independently of each other. For the influence of the textured buffer layer on the crystal orientation of the HTS layer in the layer plane to outweigh the influence of the anti-epitaxial buffer layer, the textured buffer layer is advantageously at least 20%, preferably at least 50%, and particularly preferably at least 100% thicker than the anti-epitaxial buffer layer. However, at the same time it advantageously has a thickness of 10 nm or less, preferably of 1 nm or less, and particularly preferably of 0.5 nm or less, so as not to entirely eclipse the influence of the anti-epitaxial buffer layer on the orientation of the c-axis.

The textured buffer layer can also be the only buffer layer that is disposed directly between the substrate and the HTS layer, in particular when the c-axis of the HTS layer is oriented perpendicularly to the layer plane even without the anti-epitaxial buffer layer. However, in this case as well, the layer is advantageously not thicker than 10 nm. Larger thicknesses cause the sharp step edge to be become rounded, so that the tunnel barrier in the HTS layer becomes lower but wider. As a result, it no longer acts as the weak link of a Josephson junction.

Even the normal crystal structure of the buffer layer can be sufficient texturing. For this purpose, the buffer layer advantageously has a lattice constant in the plane thereof which ranges between 90% and 100% of the lattice constant of the HTS layer along the axis to be oriented (a and/or b). One example of a buffer layer that accomplishes this is $CeO_2$. This grows epitaxially on yttria-stabilized zirconia (YSZ), which, in turn, grows epitaxially on MgO. The crystal orientation of the same in the layer plane is thus oriented perpendicularly toward the step edge, and it transfers this orientation to the a-axis of YBCO. For the buffer layer to be able to act in this way without additional texturing, the lattice constant c of the HTS layer must not be an integer multiple of the lattice constants along the axis to be oriented (a and/or b). Otherwise, the c-axis can become oriented along the buffer layer, instead of the a-axis and/or b-axis.

The texturing advantageously comprises elevations and depressions having an average height or depth between 1 nm and 10 nm, and preferably between 1 nm and 5 nm. Features of the texturing that are too small no longer act reproducibly on the orientation of the HTS layer in the plane. Features that are too large can cause a-axis-oriented grains of the HTS layer to grow.

The radius of curvature of the substrate at the step edge is advantageously 10 nm or less, preferably 5 nm or less, and particularly preferably 1 nm or less. The bend in the substrate surface at this location is still sufficiently strong incentive for the HTS layer to form a grain boundary, and consequently the weak link of the Josephson junction, even if one or more buffer layers are disposed between the HTS layer and the substrate. The bend is ideally so sharp that a linear interface forms in the HTS layer between two grains, the orientations of which differ in the c-axes thereof.

In a further advantageous embodiment of the invention, the step edge separates a planar surface region from a curved surface region. The radius of curvature of the curved region is advantageously 10 nm or more, preferably 100 nm or more, and particularly preferably 1 μm or more. The HTS layer then extends beyond the step edge in the shape of a slide. It is thus ensured that the HTS layer forms only one grain boundary, and consequently only one weak link, as a result of the step edge. If it were to form two or more weak links connected in series, the component would not be usable as a Josephson junction. This is due to the fact that the angle θ between the crystal orientations of the two grains will generally be different for multiple series-connected weak links. If, in contrast, this angle θ is made the same for multiple series-connected weak links, the series connection of these weak links can be usable as an effective Josephson junction.

This can be implemented in a further advantageous embodiment by the step separating two planar regions of the substrate having a first orientation and being tilted with respect to these planar regions, so that, on this step, the high-temperature superconducting functional layer assumes a different, but constant in the region of the step, crystal orientation of the substrate. Moreover, in this embodiment, an anti-epitaxial buffer layer must be dispensed with so as to allow the orientation of the c-axis of the functional layer to be controlled precisely by the substrate.

The surface of the substrate at the step edge is advantageously bent by an angle between 20° and 60°, preferably between 30° and 50°, and particularly preferably between 35° and 45°. In particular a bending angle of 40° causes an optimal angle θ between the c-axes of the two grains of the HTS layer converging at the grain boundary.

The texturing is advantageously rectangular or linear. Linear texturing is able to orient the a-axis or b-axis on every grain; rectangular texturing can orient both axes on every grain.

Any material in which the wave function of the Cooper pairs propagates anisotropically, as described, and in which a grain boundary represents a local barrier for the propagation of this wave function, is suitable for the HTS layer. Thus, in addition to YBCO, all other oxidic high-temperature superconductors are also suitable.

At a given critical current density $J_c$ of a HTS layer having a given thickness, the critical current $I_c$ that is able to flow through a lateral structure having a particular width results as $I_c = J_c * width * thickness$. The HTS layer is therefore structured laterally in a component having a defined $I_c$, for example in the form of a bridge having a defined width extending beyond the step edge. Such a bridge can be used to implement a detector and generator for THz radiation, or an RF SQUID, and two bridges can also be used to create a DC SQUID. The invention therefore also relates to a detector and generator for THz radiation and to a SQUID comprising the component according to the invention. The SQUID can be expanded with a flux transformer, for example as defined by German patent application 10 2009 025 716.0, to form a highly sensitive magnetometer and/or gradiometer.

The basic principle described here of generating a grain boundary at the step edge and orienting the crystal orientation of the layer in relation to this grain boundary on both sides of the step edge can be applied in a very general context. For example, ferromagnetic, ferroelectric and multiferroic properties of the tunnel barrier between crystalline oxidic layers can be rendered usable for novel electronic components.

In a further particularly advantageous embodiment of the invention, the substrate is textured, and a further seed layer made of the material of the functional layer is disposed between the substrate and the high-temperature superconducting functional layer. As a result of the texturing, the a and/or b crystal axes in the plane of the seed layer are oriented perpendicularly to the grain boundary to within a deviation of no more than 10° on both sides of the step edge. At the same time, a barrier layer, which is impervious to at least one metallic or semiconducting element of the substrate, is disposed between the seed layer and the high-temperature superconducting functional layer. All of the above descriptions with respect to the texturing continue to apply to the texturing.

Imperviousness within the meaning of the present embodiment shall be understood to mean that said element of the substrate diffuses more slowly in the material of the barrier layer by at least one order of magnitude than in the material of the seed layer or functional layer.

It is known (Hao et al., "Microstructure and magnesium diffusion in $YBa_2Cu_3O_{7-\delta}$ d films on bicrystal MgO Substrates", Journal of Applied Physics 91 (11), 9251-9254 (2002)) that certain metallic or semiconducting elements of substrates can degrade the quality of a functional layer that is grown on such substrates as a result of these reacting with the material of the functional layer and/or introducing defects into the functional layer. In particular magnesium, aluminum and silicon shall be mentioned as examples of such interfering elements. Precisely the oxides of magnesium, aluminum and silicon, however, are preferred substrates for growing on YBCO, for example, as a high-temperature superconductor, due to their suitable lattice constant, small relative permittivity and low prices. The barrier layer now allows the drawback of such substrates contaminating the functional layer to be overcome.

If, as proposed by Hao et al., the barrier layer were now directly applied to the substrate, the crystal structure thereof would be oriented based on the crystal structure of the substrate and not based on the texturing of the same; no graphoepitaxy would take place. The orientation according to the invention of the crystallographic orientation in the functional layer on both sides of the step edge would thus be lost. For this reason, the seed layer is provided, which can be applied either directly onto the substrate, or mediated by an anti-epitaxial buffer layer. Entirely analogously to the functional layer in a component according to the invention having no barrier layer and no seed layer, the orientation of the seed layer is oriented on both sides of the step edge by graphoepitaxy so that a grain boundary develops at the step edge. The orientation thus established is taken over by the barrier layer and passed on to the functional layer. Ultimately, the functional layer thus continues to be oriented indirectly as a result of the texturing of the substrate. However, at the same time, the barrier layer is protected from the penetration of metallic or semiconducting contaminants from the substrate.

The seed layer is advantageously designed to be normally conducting. Within the meaning of the present embodiment, this shall be understood to mean that the superconducting properties thereof are inferior, by at least one order of magnitude, to those of the functional layer. Since the seed layer is made of the same material as the functional layer, it could, in principle, likewise be high-temperature superconducting. However, in this embodiment the high-temperature superconduction is deliberately suppressed in the seed layer to prevent the seed layer from forming a path for a supercurrent which competes with the functional layer. Such a competing path could cause noise and interfere with the function of the component. Superconduction can be suppressed, for example, by designing the seed layer to be very thin. It is then completely contaminated with metal or semiconductor from the substrate; there is no non-contaminating path left in the seed layer along which any supercurrent could still flow. The seed layer therefore advantageously has a thickness of no more than 50 nm, preferably between 5 and 20 nm and/or no more than ⅓ of the thickness of the functional layer. A thickness of 10 nm was found to be optimal in the experiments conducted by the inventors.

The barrier layer advantageously has a thickness between 1 nm and 1 μm, preferably between 10 and 100 nm, and particularly preferably between 20 and 40 nm. The lower limit of 1 nm is due to the fact that 1 nm is the typical step height of seed layers made of high-temperature superconducting materials such as YBCO, and complete coverage of all steps is required to suppress the diffusion of metallic or semiconducting contaminants from the substrate via the seed layer into the functional layer. The upper limit of 1 μm is due to the fact that the barrier layer has a different thermal coefficient of expansion than the functional layer and/or the substrate. Each of the layers must be grown on at a high temperature. The thicker the barrier layer is, the greater is the risk that mechanical stress between the barrier layer and the remaining layers will cause the layer stack to be torn apart. It is further desirable that the lowest possible number of imperfections are introduced into the layer stack by the barrier layer and that the barrier layer does not require a disproportionate amount of time to produce. The barrier layer typically grows at a rate of only approximately 30 nm per hour. A barrier layer having a thickness of 30 nm reliably covers the grain boundary of the seed layer located beneath, and thus ensures that no path forms along this grain boundary, along which metallic or semiconducting contaminants can diffuse from the substrate into the functional layer.

The barrier layer advantageously has a perovskite structure. Since the majority of high-temperature superconducting functional layers, in particular YBCO, likewise have a perovskite structure, optimal transfer of the crystallographic orientation taken over from the seed layer by way of graphoepitaxy is ensured in the functional layer. In particular $SrTiO_3$, $LaAlO_3$ and $NdGaO_3$ are suitable materials for the barrier layer.

A method for producing a component comprising a Josephson junction from a substrate having at least one step edge in the surface thereof was also developed within the scope of the invention. For this purpose, a high-temperature superconducting layer (functional layer) is applied to the surface so as to extend on both sides of the step edge. This method is particularly suitable for producing components according to the invention. The disclosure that is provided for the component according to the invention therefore expressly applies, mutatis mutandis, to this method.

According to the invention, the substrate is textured and/or a textured buffer layer is applied to the substrate. Thereafter, the high-temperature superconducting layer (functional layer) is applied by way of graphoepitaxy so that the layer forms a grain boundary at the step edge and the a-axis and/or b-axis are oriented perpendicularly to the grain boundary to within a deviation of no more than 10°, as a result of the texturing.

It was found that, by precisely using graphoepitaxy, layer growth can be achieved in which the a-axis and/or b-axis are homogeneously oriented perpendicularly to the grain boundary. Graphoepitaxy initially begins with islands forming on edges and in corners of the texturing, the orientation of the islands often being independent of the crystal structure of the substrate. The texturing thus causes these islands to be uniformly oriented, regardless of where they form and in what sequence. When the islands are increased to form a complete layer, the short-range order of the individual islands turns into a long-range order of the layer. This collective long-range order also captures islands that initially grew with misorientation, or without orientation at all.

When growing YBCO and other oxidic high-temperature superconductors (HTS) having a layered crystal structure, growth kinetics and the energetic conditions on the surface favor the formation of islands (platelets) with (100)-, (010)- and (001)-oriented surfaces. The [100] and [010] axes of these islands are oriented on edges, elevations or depressions of the surface to which the HTS is applied. When a texturing having such features that are oriented perpendicularly to the step edge is introduced into the substrate or into a buffer layer that is applied between the substrate and the HTS, initially the islands, and later the a-axis and/or b-axis of the entire layer, can be oriented toward the step edge, and consequently toward the grain boundary.

For example, YBCO can be applied to MgO or YSZ. The lattice mismatches from YBCO to MgO and YSZ are 9% and 4%, respectively. The higher the lattice mismatch, the higher the surface energy of the HTS layer that grows will be. This also increases the potential energy that those surface configurations which do not correspond to the energy minimum have, as compared to this minimum. This potential energy, in turn, is the driving force for reorientation. As a result, achieving monocrystalline growth becomes more difficult with increasing lattice mismatch, but it becomes easier to grow by way of graphoepitaxy.

For producing components according to the invention corresponding to the embodiment comprising the seed layer and the barrier layer, an alternative method was developed, which is characterized by a different sequence of method steps. The substrate is textured at the beginning of this method. Thereafter, a seed layer made of the material of the functional layer is applied by way of graphoepitaxy so that the seed layer forms a grain boundary at the step edge and the a-axis and/or b-axis thereof is oriented perpendicularly to the grain boundary to within a deviation of no more than 10°, as a result of the texturing. The seed layer is thus already given exactly the crystallographic orientation that the functional layer is to be given in the end.

By subsequently epitaxially applying a barrier layer, which is impervious to at least one metallic or semiconducting element of the substrate, to the seed layer, the crystallographic orientation of the seed layer is transferred to the barrier layer. By subsequently applying the high-temperature superconducting functional layer, again epitaxially, to the barrier layer, the same crystallographic orientation is transferred to the final functional layer.

As a result, the functional layer also forms a grain boundary at the step edge, and the a-axis and/or b-axis thereof is calculated perpendicularly to the grain boundary to within a deviation of no more than 10%. The source for this orientation is ultimately the texturing of the substrate; the orientation, however, is mediated by the seed layer and the barrier layer.

In a particularly advantageous embodiment of the invention, the orientation of the c-axis of the high-temperature superconducting layer (functional layer) or of the seed layer is decoupled from the orientation of the substrate by applying an anti-epitaxial buffer layer, which is either amorphous or has a crystal structure that is not epitaxy-compatible with the substrate and/or with the high-temperature superconducting layer (functional layer) or with the seed layer, before the high-temperature superconducting layer (functional layer) or the seed layer is applied. The anti-epitaxial buffer layer itself can be textured. However, it can also be applied between the substrate and the textured buffer layer, or between the textured buffer layer and the HTS layer (functional layer) or the seed layer. When the c-axis of the HTS layer (functional layer) or of the seed layer is decoupled from the orientation of the substrate, the orientation is based solely on the energetic conditions of the HTS layer or of the seed layer. Orientation of the c-axis perpendicularly to the layer plane is therefore preferred.

One alternative is to dispense with the anti-epitaxial buffer layer, but continue to use the texturing or textured layer, and optionally the barrier layer. In the absence of the anti-epitaxial buffer layer, the c-axis of the HTS layer (functional layer) or of the seed layer is based on the crystal structure of the substrate. Using the example of a MgO substrate comprising YBCO as the HTS layer (functional layer) or seed layer, there are two preferred orientations of the c-axis: 0 degrees ("cube-on-cube") and 45 degrees. If the step extends at an angle steeper than 19 degrees with respect to the planar regions of the substrate, 45-degree orientation is formed in the region of the step, and 0-degree orientation is formed in the planar regions. Grain boundaries form accordingly at the respective transitions of the step between the planar regions, at which the crystal orientation of the functional layer changes in each case by an angle $\theta=45$ degrees. A barrier layer above the seed layer also continues to be desirable in this case so as to reduce or prevent contamination of the HTS layer (functional layer). The Josephson junction created in this embodiment, having two grain boundaries (weak links) with a respective $\theta=45$-degree angle change of the crystal orientation, has less mechanical stress and fewer low-angle grain boundaries, and can thus advantageously offer lower background noise as compared to Josephson junctions formed of only one grain boundary. The step should advantageously not extend in a curved (slide-shaped) manner for this purpose, but should have a respective edge at the upper and lower transitions thereof to the planar regions of the substrate. This also relates to the production of detectors and generators of THz radiation and to the production of SQUIDs based on such Josephson junctions.

Two different methods exist for producing an edge. Each method uses dry etching and employs a photoresist layer that is applied to subregions of the substrate as a mask.

In the first method, the ion beam for dry etching is projected into the angle formed between the substrate and the edge of the photoresist layer. Thereafter, the angle of the step edge is determined by the etching time. This method is particularly advantageous when a sharp edge is to be created at the upper rim of the step and the step is to have a slide-shaped rounded progression elsewhere.

In the second method, the ion beam for dry etching is projected across and past the upper edge of the photoresist layer onto the substrate surface. The angle of the step edge is then determined by the angle formed between the ion beam and the substrate surface. The angle thus becomes easier to control. This method is advantageous if two grain boundaries having an identical angle $\theta$ between the crystal orientations are to be generated.

The subject matter of the invention will be described hereafter based on figures, without thereby limiting the subject matter of the invention.

DESCRIPTION OF THE PREFERRED EMBODIMENTS

Figure 1:
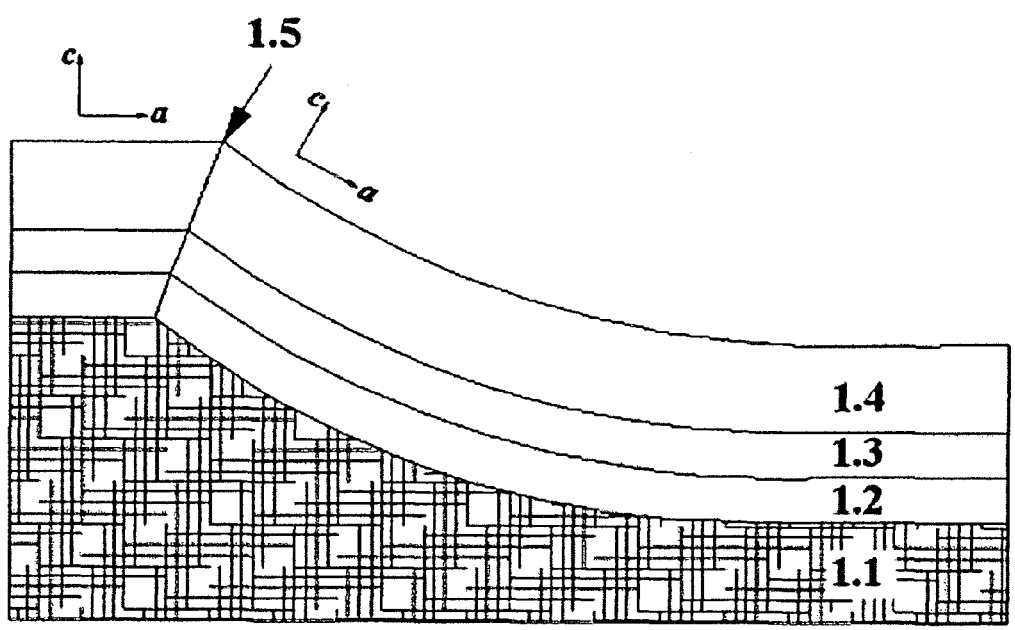
FIG. 1: shows an exemplary embodiment of the component according to the invention comprising two buffer layers.

FIG. 1 shows an exemplary embodiment of the component according to the invention. A textured, homoepitaxial MgO buffer layer 1.2 measuring approximately 10 nm thick is located on the substrate 1.1 made of MgO having a surface cleaned by way of ion beam etching. An amorphous layer was removed from the surface of the substrate as a result of the cleaning process; this makes homoepitaxial growth possible. Due to the rough island structure of the buffer layer 1.2, texturing is provided automatically. An anti-epitaxial buffer layer 1.3 made of $MgCO_3$ measuring approximately 0.5 nm thick is located on the homoepitaxial buffer layer 1.2. This layer decouples the orientation of the c-axis of the approximately 150 nm thick YBCO layer (functional layer) 1.4 applied thereto from the influence of the substrate 1.1. The c-axis is consequently perpendicular to the surface of the YBCO layer 1.4 everywhere. At the same time, the a-axis and b-axis are oriented on the rectangular island structure (texturing) of the homoepitaxial MgO layer. The amorphous $MgCO_3$ buffer layer can be produced using various deposition methods. For example, the $MgCO_3$ can be formed by way of a brief chemical reaction of the MgO in $CO_2$ plasma or in organic liquids such as acetone. Of course it can also grow on by exposure of the MgO surface to air. Instead of $MgCO_3$, it is also possible to use a $CeO_2$ layer measuring 0.5 nm to 1 nm thick as the anti-epitaxial buffer layer.

The substrate 1.1 has a sharp step edge. This prompts the YBCO layer 1.4 to form a grain boundary 1.5. This boundary forms the weak link of the Josephson junction. The step edge separates a planar surface region of the substrate 1.1 from a curved region, which in turn transitions steadily into a further planar region. The radius of curvature is sufficiently wide, in each case, that the YBCO layer (functional layer) 1.4 does not form a further grain boundary.

The texturing of the buffer layer 1.2 has a preferred direction perpendicular to the step edge of the substrate 1.1. Accordingly, the a-axis and/or b-axis of the YBCO layer 1.4 are oriented, in each case, perpendicularly to the grain boundary 1.5, on both sides of the step edge. In this way, a maximal supercurrent $I_c$ with maximal normal-state resistance $R_n$ can be transported through the grain boundary 1.5.

The lateral structuring of the YBCO layer 1.4 in the layer plane, which forms the particular component from the layer, is not shown in FIG. 1.

Figure 2:
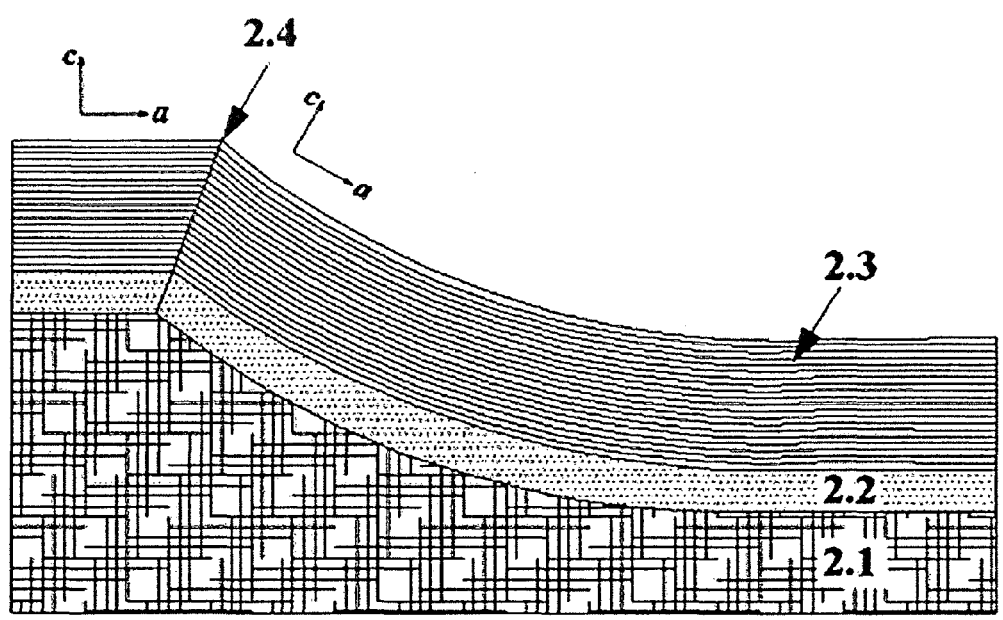
FIG. 2: shows an exemplary embodiment of the component according to the invention comprising only one buffer layer.

FIG. 2 shows a further exemplary embodiment of the component according to the invention. An anti-epitaxial layer 2.2, which is also textured, is applied to the substrate 2.1. This layer thus decouples the orientation of the c-axis of the YBCO layer (functional layer) 2.3 applied thereto from the influence of the substrate 2.1, while the texturing thereof at the same time orients the a-axis of the YBCO layer 2.3 in the direction of the grain boundary 2.4. The cause for the grain boundary 2.4 is the step edge in the substrate 2.1. The lateral structuring of the YBCO layer (functional layer) 2.3 in the layer plane, which forms the particular component from the layer, is not shown in FIG. 2.

Figure 3A:
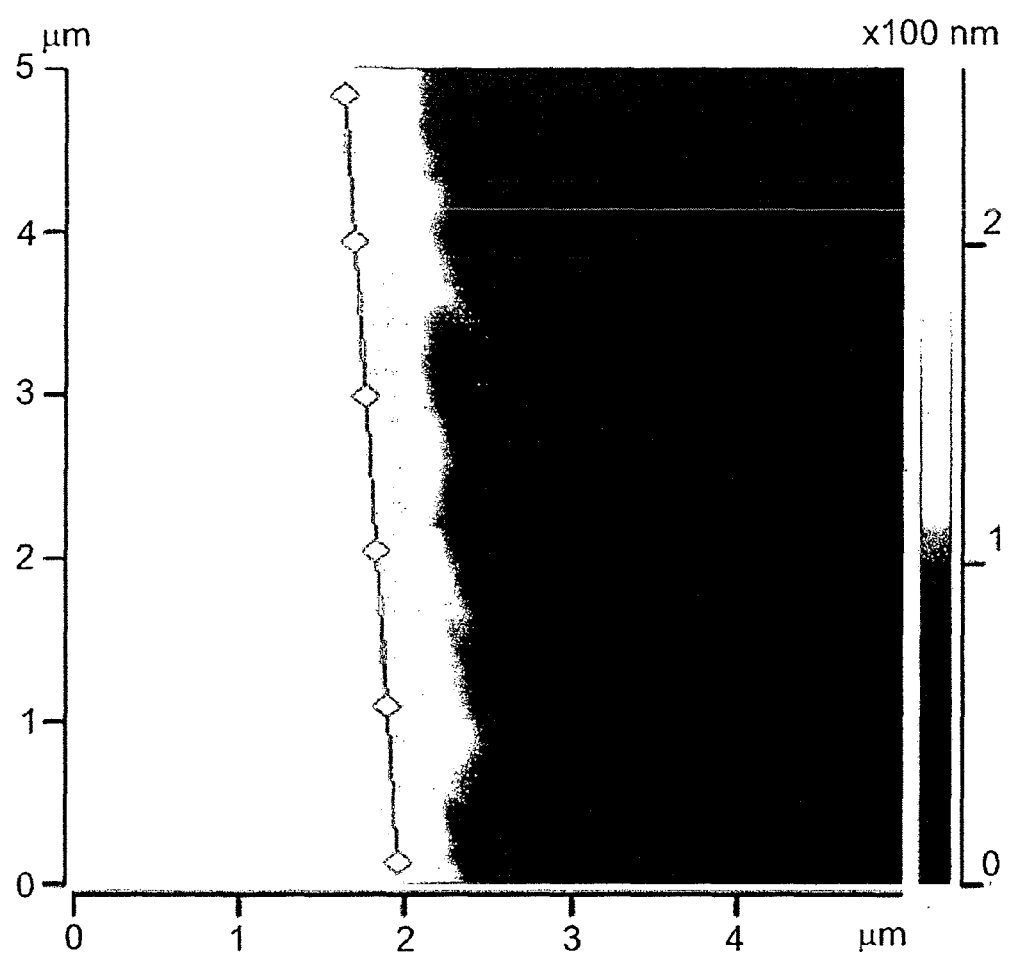
FIG. 3: is an AFM image of a textured substrate.
Figure 3B:
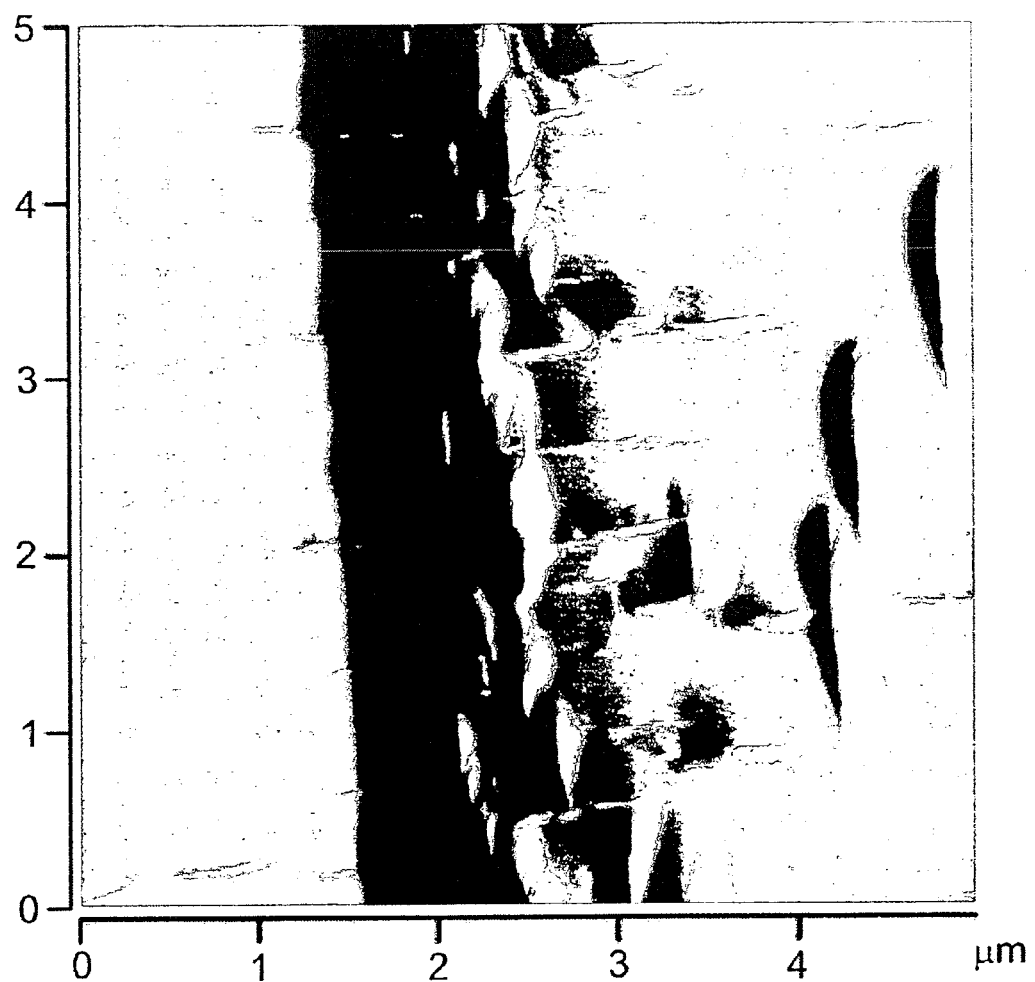
Figure 3C:
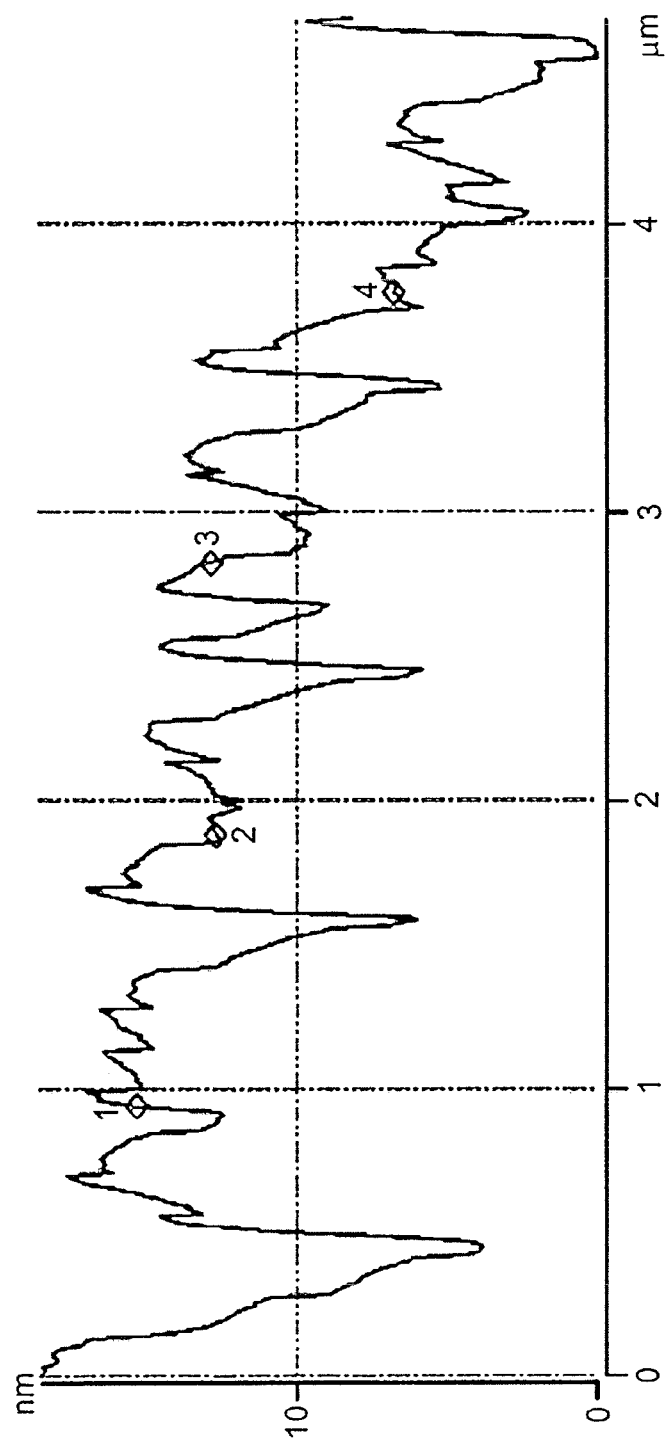

FIG. 3 shows an AFM image of a textured substrate. Sub-image a is the topographical image; sub-image b shows the phase signal, in which topographical features do not appear true to height, but in a clarified manner. Sub-image c is a line scan, which was taken from the topographical image in the immediate vicinity of the step edge.

Four points 1 to 4 are marked in the line scan of image 3*c*. The table below indicates the lateral distance from one point to the remaining points above the diagonal, and the difference in height between one point and the remaining points below the diagonal.

|         | Point 1   | Point 2     | Point 3     | Point 3     |
|---------|-----------|-------------|-------------|-------------|
| Point 1 |           | 941.662 nm  | 1883.32 nm  | 2824.98 nm  |
| Point 2 | 2.6 nm    |             | 941.662 nm  | 1883.32 nm  |
| Point 3 | 2.45 nm   | 0.14 nm     |             | 941.662 nm  |
| Point 4 | 8.56 nm   | 5.96 nm     | 6.11 nm     |             |

Figure 4A:
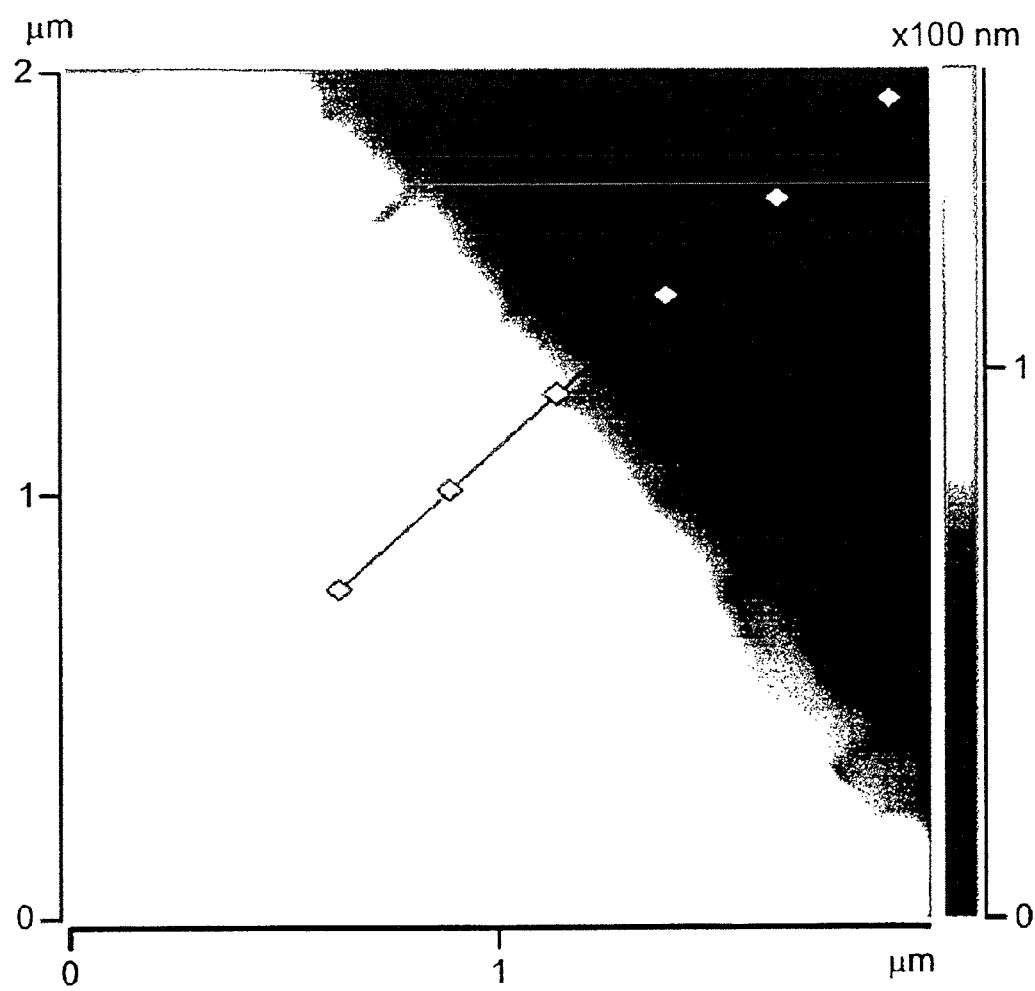
FIG. 4: is an AFM image of a YBCO layer on an anti-epitaxial buffer layer made of $MgCO_3$, which, in turn, was applied to a textured MgO substrate.
Figure 4B:
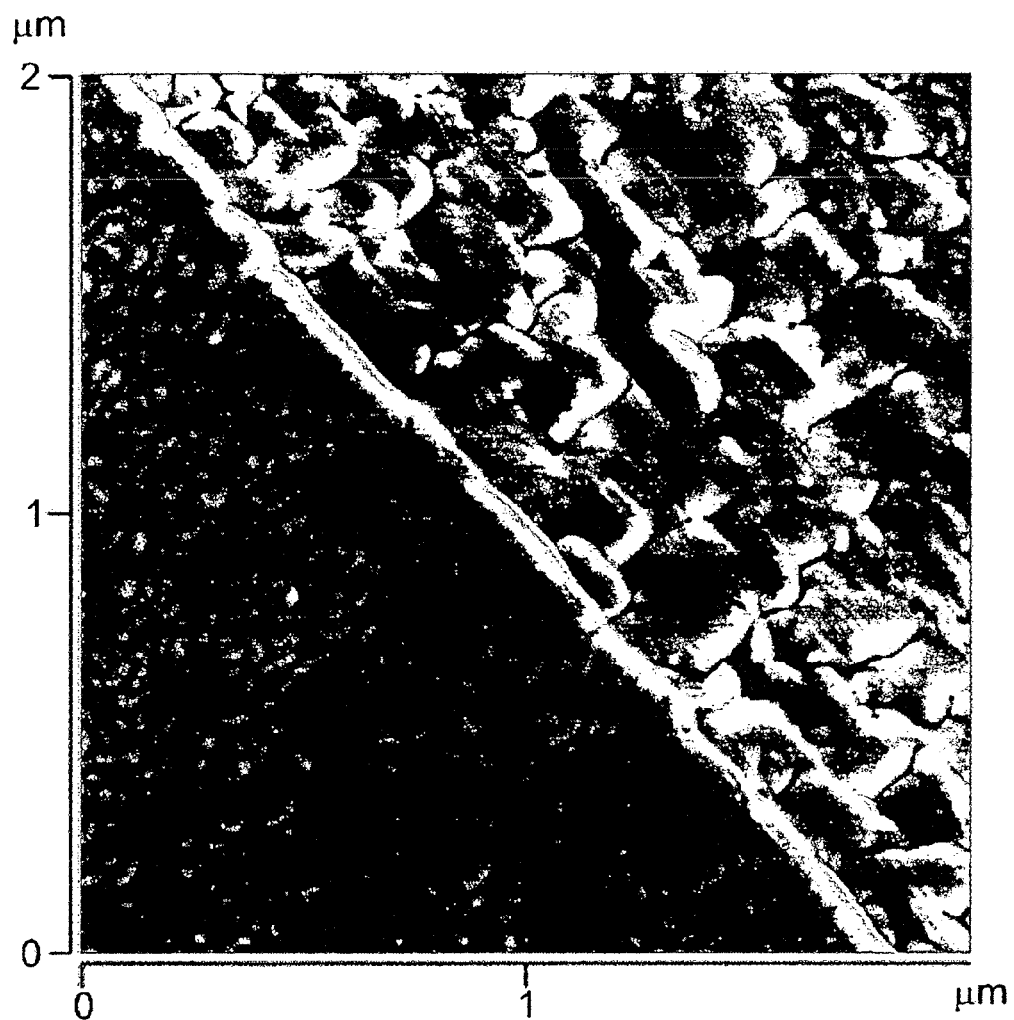
Figure 4C:
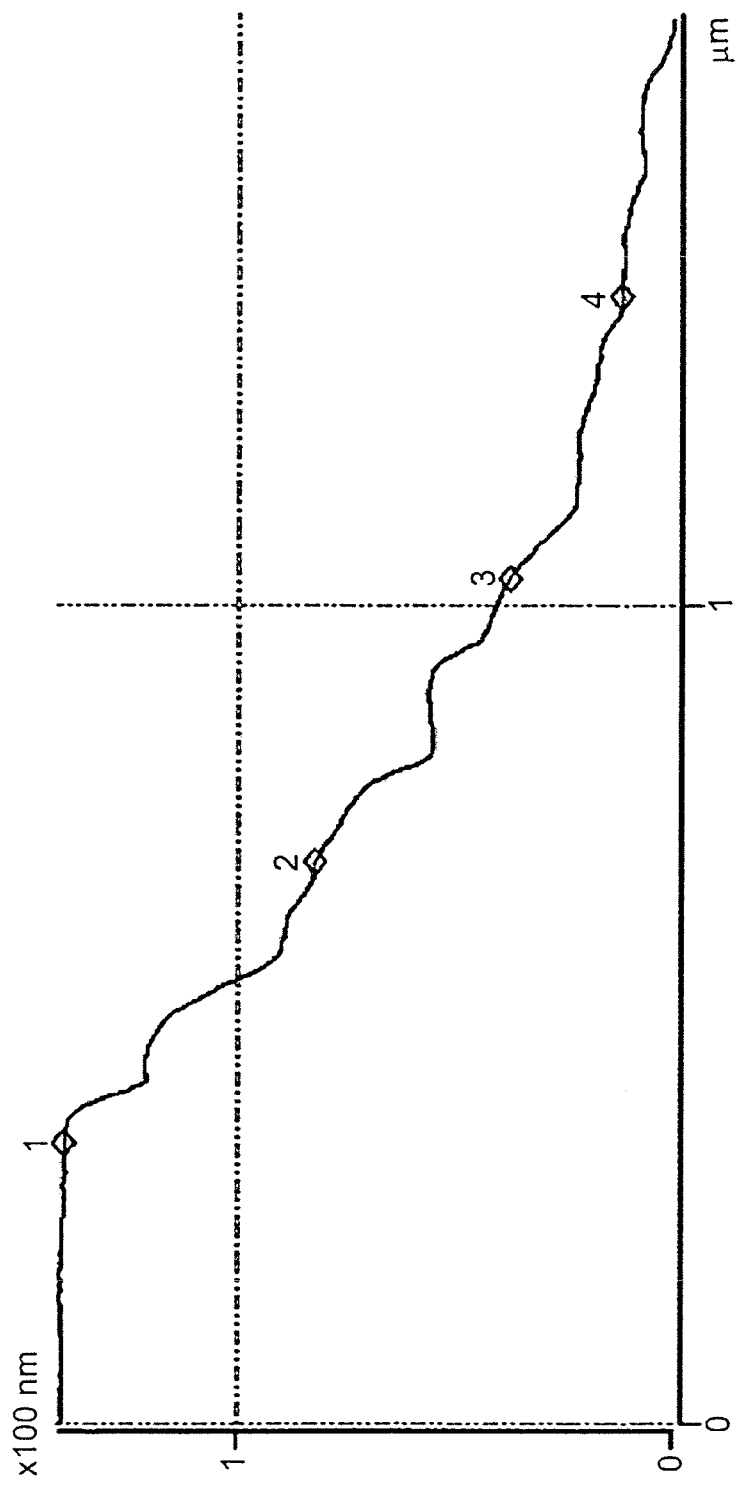

FIG. 4 shows an AFM image of a YBCO layer (functional layer), which was grown on an anti-epitaxial buffer layer made of $MgCO_3$, which in turn was grown on a textured MgO substrate. By suitable lateral structuring, which creates a Josephson junction having defined dimensions and consequently also defined $I_c$, a component comprising a Josephson junction can be produced from this layer. Sub-image a shows the topographical image, and sub-image b shows the phase signal. Sub-image c is a line scan taken from the topographical image. In sub-images a and b, the step edge extends diagonally from the top left to the bottom right.

Phase image b clearly shows that the crystal structure of the YBCO changes drastically at the step edge. On the upper plateau of the step edge on the bottom left of the image, the YBCO is grown on in approximately rectangularly delimited spiral structures, wherein one side of the rectangle is oriented perpendicularly to the step edge, and consequently perpendicularly to the grain boundary, between the two different crystal orientations. Beyond the step edge, at the top right of the image, the YBCO is grown on in a rougher structure comprising rectangularly delimited islands, of which one side is again oriented perpendicularly to the step edge.

Four points 1 to 4 are marked in the line scan of image 4*c*. The table below indicates the lateral distance from one point to the remaining points above the diagonal, and the difference in height between one point and the remaining points below the diagonal.

|         | Point 1    | Point 2     | Point 3     | Point 4     |
|---------|------------|-------------|-------------|-------------|
| Point 1 |            | 344.535 nm  | 689.07 nm   | 1033.6 nm   |
| Point 2 | 57.69 nm   |             | 344.535 nm  | 689.07 nm   |
| Point 3 | 102.55 nm  | 44.86 nm    |             | 344.535 nm  |
| Point 4 | 127.79 nm  | 70.1 nm     | 25.24 nm    |             |

Figure 5:
FIG. 5: is an electron microscope image of a YBCO layer that was grown on an anti-epitaxial buffer layer that is too thick.

FIG. 5 shows a scanning electron microscopic image of a failed attempt to produce a component according to the invention. The image shows the surface of a YBCO layer, which was grown on an approximately 10 nm thick anti-epitaxial buffer layer made of $MgCO_3$ and which was not yet laterally structured. This anti-epitaxial buffer layer, in turn, was grown on a textured MgO substrate having a step edge. The step edge runs vertically from top to bottom in the center of the image.

The YBCO was grown on in the shape of terrace-like grains having an approximately rectangular base area. The grains grow upward along the c-axis of the YBCO. This axis is obviously perpendicular to the drawing plane, so that the anti-epitaxial buffer layer has successfully decoupled the orientation of the c-axis from the influence of the substrate, which strives to rotate the c-axis into the layer plane. The edges of the base area of each grain are the a and b crystal axes of the YBCO. The a and b crystal axes form an angle of 45° with the step edge in almost all grains that are visible. This is precisely the angle at which only a minimal supercurrent can be transported between the two electrodes of the Josephson junction on the two sides of the step edge. The inventor attributes this to the fact that the anti-epitaxial buffer layer was too thick. It not only decoupled the orientation of the c-axis of the YBCO layer from the substrate, but also shielded the YBCO layer so strongly from the texturing that was introduced into the substrate, that this was no longer able to orient the a-axis and b-axis of the YBCO.

Figure 6:
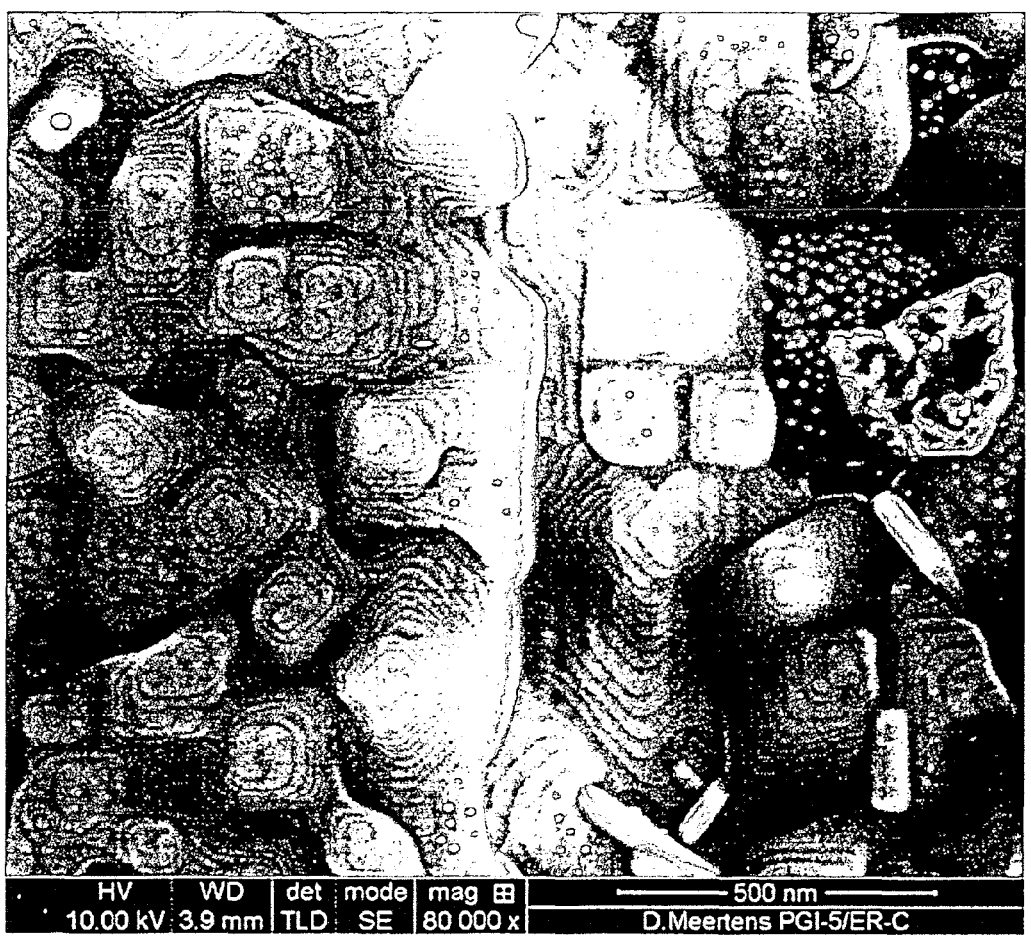
FIG. 6: is an electron microscope image of a YBCO layer that was grown on an anti-epitaxial buffer layer that is thinner compared to FIG. 5.

FIG. 6 shows an equivalent detail of a successfully produced YBCO layer (functional layer) according to the invention prior to lateral structuring to form the particular component. The thickness of the anti-epitaxial buffer layer was reduced to 0.5 nm compared to FIG. 5. This caused the a-axis of by far the largest majority of grains to be positioned perpendicularly to the step edge extending from top to bottom in the center of the image. As a result, a maximal supercurrent can be transported over the step edge, and consequently also over the Josephson junction. At the same time, the anti-epitaxial buffer layer has still decoupled the orientation of the c-axis from the influence of the substrate. The orientation of the c-axis is unchanged over FIG. 5.

Figure 7:
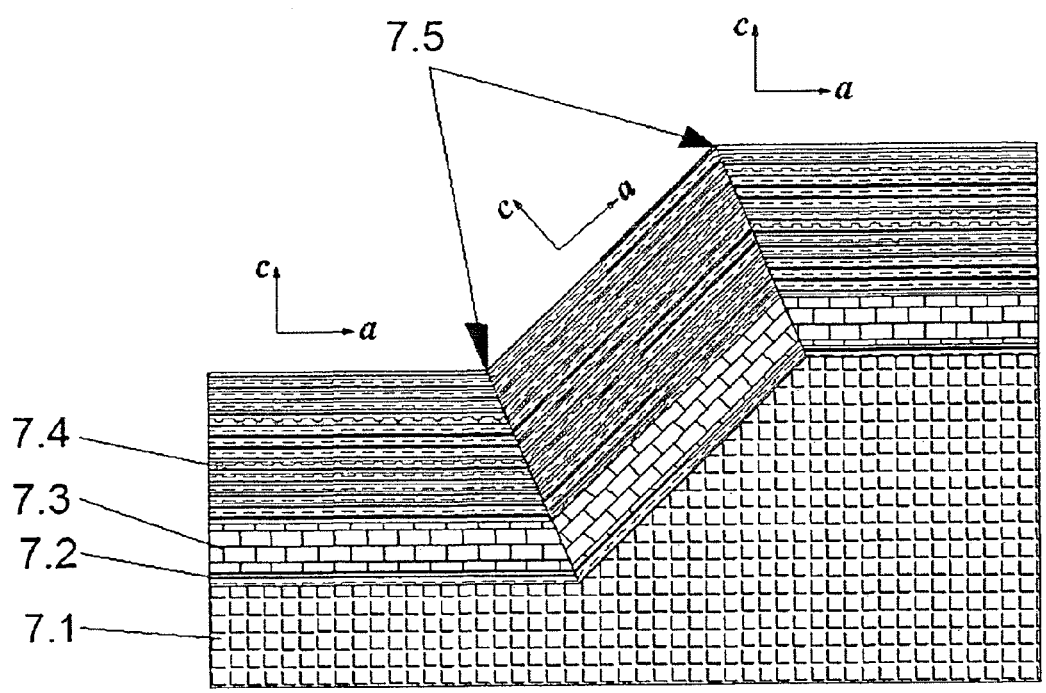
FIG. 7: shows a schematic drawing of an exemplary embodiment of the component according to the invention comprising a barrier layer and a seed layer.

FIG. 7 is a schematic illustration of an exemplary embodiment of the component according to the invention comprising a barrier layer and a seed layer. Initially, a 10 nm thick YBCO seed layer 7.2 is applied to the textured MgO substrate 7.1, the crystallographic orientation of the seed layer already being oriented on the texturing of the substrate 7.1, by way of graphoepitaxy, in the same manner as is desirable for the later functional layer 7.4. A 30 nm thick SrTiO$_3$ (STO) barrier layer 7.3 was epitaxially grown on the seed layer 7.2 and assumes the orientation of the seed layer 7.2. The functional layer 7.4 grown thereon, in turn, assumes the orientation of the barrier layer 7.3, and thus the orientation of the seed layer 7.2. The functional layer 7.4 is thus oriented exactly as if it had been grown directly on the substrate 7.1. By the seed layer 7.2 having formed a respective grain boundary at the two step edges of the substrates when the layer was grown on the substrate 7.1, a respective grain boundary 7.5 has formed at this location in the barrier layer 7.3, and ultimately also in the functional layer 7.4. At the same time, the functional layer 7.4 is protected by the barrier layer 7.3 from magnesium penetrating from the substrate 7.1.

Figure 8A:
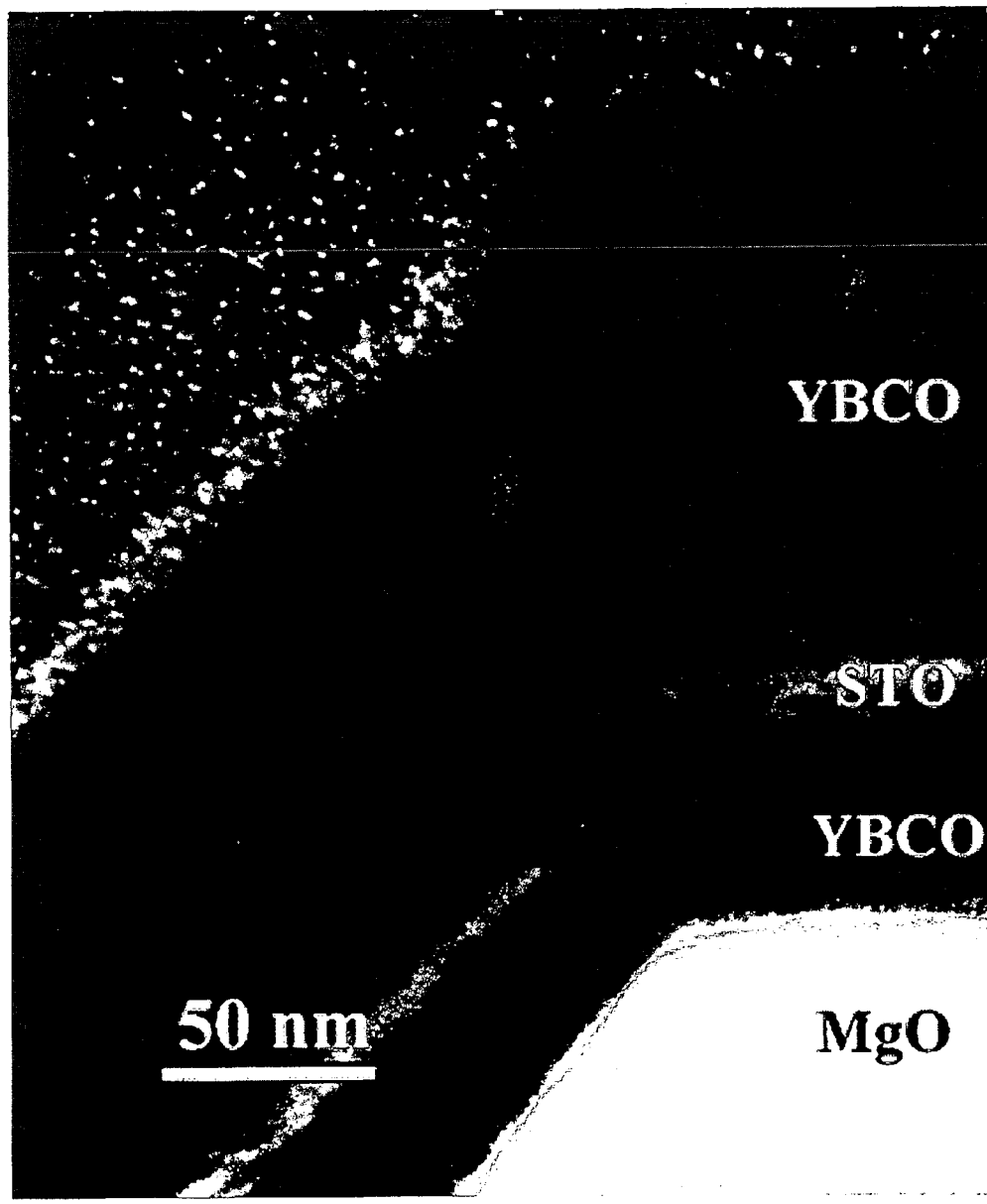
FIG. 8: shows electron microscope cross-sectional images of the exemplary embodiment shown schematically in FIG. 7.
Figure 8B:
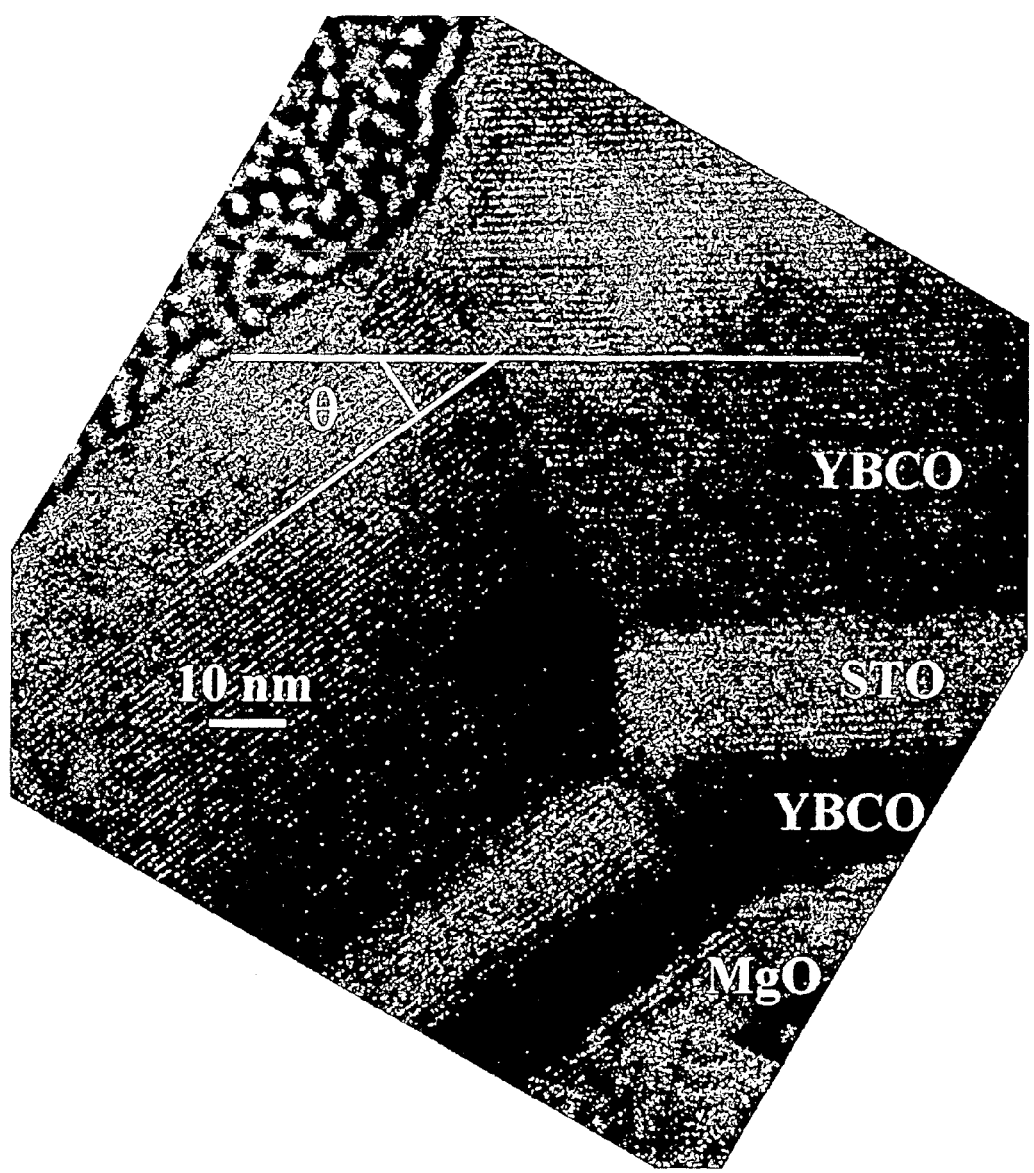

FIG. 8 shows transmission electron microscope cross-sectional images of the exemplary embodiment schematically illustrated in FIG. 7 at two different magnification levels (sub-images a and b). Only the region around the right step edge in the substrate 7.1 shown in FIG. 7 is illustrated. The angle θ drawn in FIG. 8b illustrates the tilt of the crystal orientation at the grain boundary, which is caused by the step in the substrate and extends through all the layers of the layer stack. The SrTiO$_3$ (STO) barrier layer shows a constriction locally at the grain boundary. This means it could not be designed to be considerably thinner without potentially creating a path at the grain boundary, along which magnesium could diffuse into the YBCO functional layer located above the STO layer.

Figure 9:
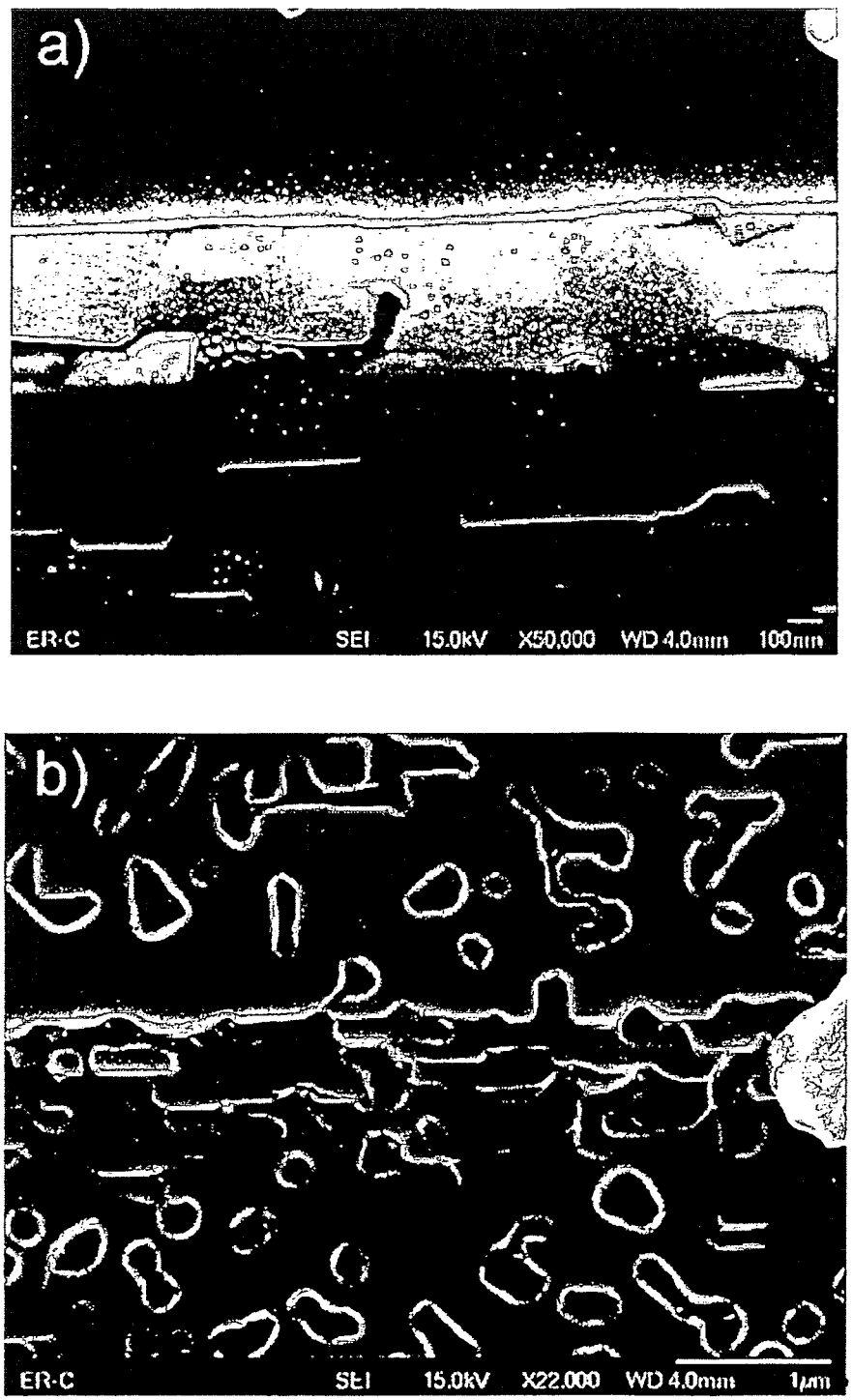
FIG. 9: shows electron microscope views onto the functional layers of two components according to the invention without (a) and with (b) the barrier layer and the seed layer.

FIG. 9 shows electron microscope views onto the functional layers of two components according to the invention without (a) and with (b) the barrier layer and the seed layer. Only few defects are apparent in the component comprising the barrier layer and the seed layer. In the component without barrier layer and seed layer, chemical reactions with magnesium that diffused in from the substrate have eaten multiple holes into the functional layer. The $J_c*R_n$ product is already significantly improved for the component without the barrier layer and the seed layer with 300 μV at 77 K as compared to the related art, although many possible current paths in the functional layer are interrupted by the holes. The barrier layer and the seed layer increase the $J_c*R_n$ product to approximately 1 mV at 77 K. Analogously, the critical temperature $T_c$ of the component comprising the barrier layer and the seed layer is approximately 10 K higher than for the component without the barrier layer and the seed layer.

Figure 10:
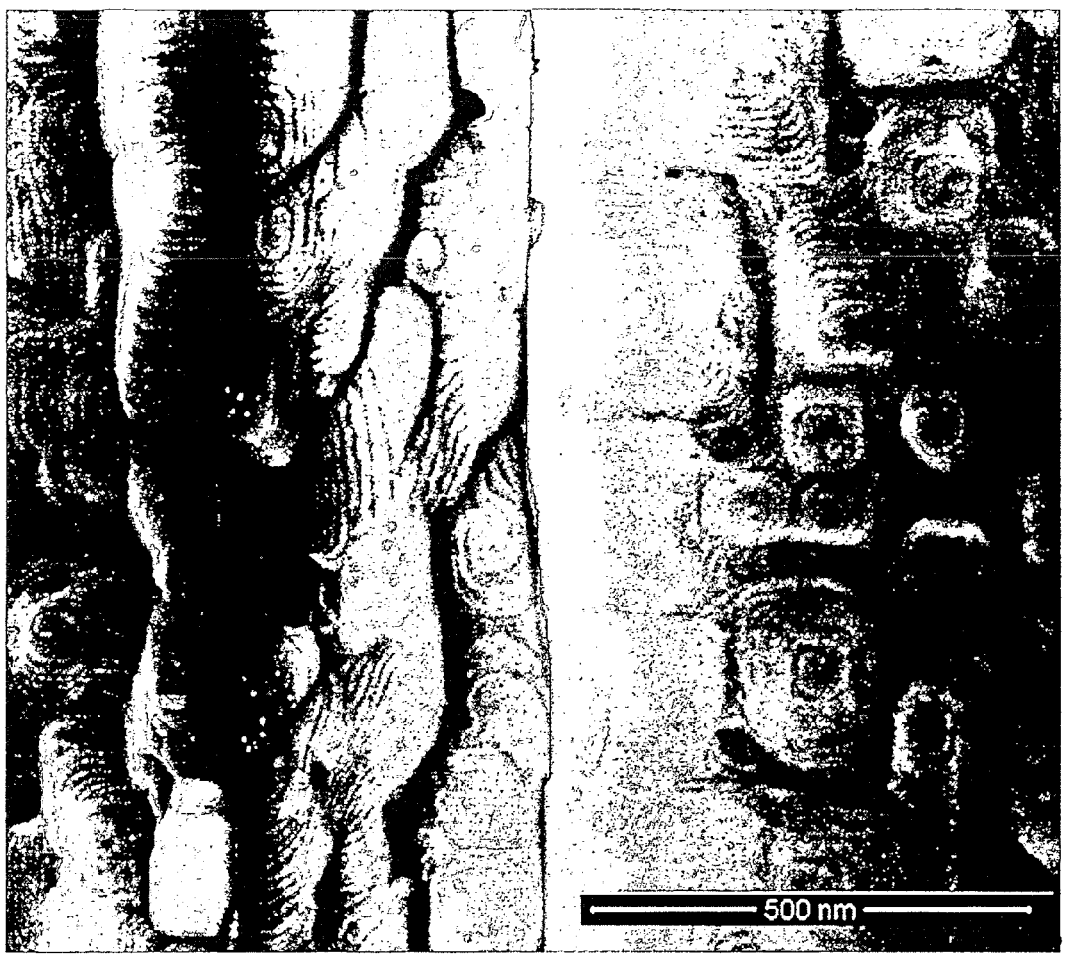
FIG. 10: is an electron microscope image of a YBCO layer, which has texturing and comprises a YBCO seed layer and a $SrTiO_3$ barrier layer, but was grown without an anti-epitaxial buffer layer on the 45-degree step of a MgO substrate.

FIG. 10 shows an electron microscope image of a YBCO layer that was grown with texturing and with the YBCO seed layer and the SrTiO$_3$ barrier layer, but without the anti-epitaxial buffer layer, on a MgO substrate having a 45-degree step, which separates two planar regions of the substrate. As a result of the layer in the planar regions to the right and left of the step having assumed a first orientation [001] of the substrate, and a second orientation [0011] in the region of the step, two grain boundaries have formed at the two transitions of the step to the planar regions, at which the crystal orientation of the YBCO functional layer changes in each case by the same angle θ=45°. Compared to FIG. 6, which shows the same top view onto a functional layer produced without the barrier layer and the seed layer, an even larger portion of grains are oriented with their a-axis perpendicular to the step edge extending from top to bottom in the center of the image and less Y2BaCuO phase (green phase) is formed. In FIG. 10, various light regions were contrast-enhanced to varying degrees so as to render as many grains as possible discernible. The YBCO layers have two orientations with respect to the [001] orientation of the MgO substrate: 0 degrees in the planar regions, and 45 degrees at the step.

The invention claimed is:

1. A component comprising a Josephson junction, comprising:
    a substrate comprising at least one step edge on a textured surface thereof and
    a functional layer made of a high-temperature superconducting material disposed on the textured surface of the substrate such that the functional layer also comprises at least one step edge,
    wherein a grain boundary that forms a weak link of the Josephson junction is present at the at least one step edge of the functional layer,
    wherein texturedness of the textured surface of the substrate and/or at least one first textured buffer layer disposed between the substrate and the functional layer causes, on both sides of the at least one step edge of the functional layer, an a crystal axis or a b crystal axis or both crystal axes in a plane of the functional layer to be oriented perpendicularly to the grain boundary to within a deviation of no more than 10°
    wherein the textured surface of the substrate and/or the at least one first textured buffer layer comprises elevations and/or depressions having an average height or depth of between 1 nm and 10 nm.

2. A component comprising a Josephson junction, comprising:
    a substrate comprising at least one step edge on a textured surface thereof and
    a functional layer made of a high-temperature superconducting material disposed on the surface of the substrate such that the functional layer also comprises at least one step edge,
    wherein a grain boundary that forms a weak link of the Josephson junction is present at the at least one step edge of the functional layer,
    wherein the functional layer is grown on the textured surface of the substrate and/or on a textured buffer layer disposed between the substrate and the functional layer by graphoepitaxy,
    wherein texturedness of the textured surface of the substrate on both sides of the step edge of the substrate causes an a crystal axis or a b crystal axis or both crystal axes in a plane of the functional layer to be oriented perpendicularly to the grain boundary to within a deviation of no more than 10°.

3. The component according to claim 1, wherein an anti-epitaxial buffer layer is disposed between the functional layer and the substrate, wherein the anti-epitaxial buffer layer is either amorphous or has a crystal structure that is not epitaxy-compatible with the substrate and/or with the functional layer, so that a c-axis of the functional layer is perpendicular to a surface of the anti-epitaxial buffer layer to within a deviation of no more than 10°.

4. The component according to claim 3, wherein the anti-epitaxial buffer layer has a thickness of 10 nm or less.

5. The component according to claim 3, wherein each lattice constant of the anti-epitaxial buffer layer in its layer plane is closer to lattice constants a and b in the plane of the functional layer than to any integer multiple or divisor of lattice constant c of the anti-epitaxial buffer layer.

6. The component according to claim 3, wherein the anti-epitaxial buffer layer is textured.

7. The component according to claim 3, wherein a second textured buffer layer is disposed between the substrate and the anti-epitaxial buffer layer, or between the anti-epitaxial buffer layer and the functional layer.

8. The component according to claim 1, wherein the at least one first textured buffer layer is disposed as an only buffer layer directly between the substrate and the functional layer.

9. The component according to claim 7, wherein the at least one first textured buffer layer is at least 20% thicker than the anti-epitaxial buffer layer.

10. The component according to claim 7, wherein the at least one first textured buffer layer has a thickness of 10 nm or less.

11. The component according to claim 7, wherein the at least one first textured buffer layer has a lattice constant in a plane thereof ranging between 90% and 100% of a lattice constant of the functional layer along the a-axis or the b-axis in the plane of the functional layer.

12. The component according to claim 7, wherein texturedness of the textured surface of the substrate and/or the at least one first textured buffer layer comprises elevations and/or depressions having an average height or depth between 1 nm and 10 nm.

13. The component according to claim 1, wherein a radius of curvature of the substrate at the at least one step edge is 10 nm or less.

14. The component according to claim 1, wherein the at least one step edge separates a planar surface region from a curved surface region.

15. The component according to claim 14, wherein a radius of curvature of the curved surface region is 10 nm or more.

16. The component according to claim 1, comprising a step region which separates two planar regions of the substrate having a first orientation, and is tilted with respect to the two planar regions, such that the functional layer assumes a different, but constant crystal orientation in the step region.

17. The component according to claim 1, wherein the textured surface of the substrate at the at least one step edge is bent by an angle between 20° and 60°.

18. The component according to claim 1, wherein the texturedness is rectangular or linear.

19. The component according to claim 1, wherein the substrate is textured, and a further seed layer made of a material which is same as that of the functional layer is disposed between the substrate and the functional layer,
wherein texturedness of the substrate causes an a crystal axis or a b crystal axis, or both crystal axes in a plane of the seed layer to be oriented perpendicularly to the grain boundary to within a deviation of no more than 10° on both sides of the at least one step edge of the functional layer, and a barrier layer, which is impervious to at least one metallic or semiconducting element of the substrate, is disposed between the seed layer and the functional layer.

20. The component according to claim 19, wherein the seed layer is configured to be normally conducting.

21. The component according to claim 19, wherein the seed layer has a thickness of no more than 50 nm.

22. The component according to claim 19, wherein the seed layer has a thickness of no more than ⅓ of a thickness of the functional layer.

23. The component according to claim 19, wherein the barrier layer has a thickness between 1 nm and 1 μm.

24. The component according to claim 19, wherein the barrier layer has a perovskite structure.

25. A detector or generator for THz radiation or a superconducting quantum interference device (SQUID) comprising at least one component according to claim 1.

26. A method for producing a component comprising a Josephson junction from a substrate having at least one step edge on a surface thereof, the method comprising:
applying a high-temperature superconducting functional layer to the surface so as to extend on both sides of the at least one step edge, such that the functional layer also has at least one step edge,
wherein the substrate is textured and/or a textured buffer layer is applied to the substrate, and
wherein the functional layer is applied by way of graphoepitaxy so that a grain boundary is formed at the step edge of the functional layer and an a-axis or a b-axis or both axes thereof is/are oriented perpendicularly to the grain boundary to within a deviation of no more than 10°, as a result of texturing of the substrate and/or the textured buffer layer.

27. A method for producing a component comprising a Josephson junction from a substrate having at least one step edge on a surface thereof, the method comprising:
applying a high-temperature superconducting functional layer to the surface so as to extend on both sides of the at least one step edge, said application of the functional layer comprising the following method steps:
texturing the substrate;
subsequently applying to the surface of the substrate a seed layer made of a material which is same as that of the functional layer by way of graphoepitaxy so that the seed layer forms a grain boundary at the step edge and an a-axis or a b-axis, or both axes thereof is/are oriented perpendicularly to the grain boundary to within a deviation of no more than 10°, as a result of the texturing;
subsequently applying a barrier layer which is impervious to at least one metallic or semiconducting element of the substrate, epitaxially to the seed layer; and
subsequently applying the functional layer epitaxially to the barrier layer.

28. The method according to claim 26, wherein an orientation of a c-axis of the functional layer or of the seed layer is decoupled from an orientation of the substrate by applying an anti-epitaxial buffer layer, which anti-epitaxial buffer layer is either amorphous or has a crystal structure that is not epitaxy-compatible with the substrate and/or with the functional layer or with the seed layer, before the functional layer or the seed layer is applied.

29. The component according to claim 1, wherein an orientation of the texturedness of the textured surface of the substrate or of the at least one first textured buffer layer differs from an orientation predefined by a crystal structure of the substrate or of the at least one first textured buffer layer.

* * * * *